(12) United States Patent
Iguchi

(10) Patent No.: US 7,605,406 B2
(45) Date of Patent: *Oct. 20, 2009

(54) REAR-ILLUMINATED-TYPE PHOTODIODE ARRAY

(75) Inventor: Yasuhiro Iguchi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 102 days.

This patent is subject to a terminal disclaimer.

(21) Appl. No.: 11/557,427

(22) Filed: Nov. 7, 2006

(65) Prior Publication Data

US 2007/0096178 A1 May 3, 2007

Related U.S. Application Data

(63) Continuation of application No. 11/073,322, filed on Mar. 4, 2005, now Pat. No. 7,332,751.

(30) Foreign Application Priority Data

Mar. 10, 2004 (JP) ............................. 2004-066526

(51) Int. Cl.
H01L 27/142 (2006.01)

(52) U.S. Cl. ................ 257/186; 257/465; 257/E31.022

(58) Field of Classification Search ................ 257/184, 257/186, 233, 461, 466, E31.022, 465
See application file for complete search history.

(56) References Cited

U.S. PATENT DOCUMENTS 5,189,297 A * 2/1993 Ahlgren ................ 250/214.1
6,157,404 A * 12/2000 Marshall et al. ........... 348/216.1
6,518,638 B1 * 2/2003 Kuhara et al. ............... 257/431
6,521,968 B2 2/2003 Kuhara et al.
2004/0038443 A1 2/2004 Jiao
2005/0194654 A1 9/2005 Iguchi

FOREIGN PATENT DOCUMENTS

JP  2001-144278  5/2001
JP  2001-352094  12/2001

* cited by examiner

Primary Examiner—Allan R. Wilson
(74) Attorney, Agent, or Firm—Fish & Richardson P.C.

(57) ABSTRACT

A rear-illuminated-type photodiode array has (a) a first-electroconductive-type semiconductor substrate, (b) a first-electroconductive-type electrode that is placed at the rear side of the semiconductor substrate and has openings arranged one- or two-dimensionally, (c) an antireflective coating provided at each of the openings of the first-electroconductive-type electrode, (d) a first-electroconductive-type absorption layer formed at the front-face side of the substrate, (e) a leakage-lightwave-absorbing layer that is provided on the absorption layer and has an absorption edge wavelength longer than that of the absorption layer, (f) a plurality of second-electroconductive-type regions that are formed so as to penetrate through the leakage-lightwave-absorbing layer from the top surface and extend into the absorption layer to a certain extent and are arranged one- or two-dimensionally at the positions coinciding with those of the antireflective coatings at the opposite side, and (g) a second-electroconductive-type electrode provided on the top surface of each of the second-electroconductive-type regions.

4 Claims, 5 Drawing Sheets

Example 1

Example 1

Example 2

Example 2

Example 3

REAR-ILLUMINATED-TYPE PHOTODIODE ARRAY

CROSS-REFERENCE TO RELATED APPLICATION(S)

This application is a continuation of U.S. Ser. No. 11/073,322, filed on Mar. 4, 2005 now U.S. Pat. No. 7,332,751, which in turn claims the benefit of Japanese Application No. 2004-066526, filed on Mar. 10, 2004.

BACKGROUND OF THE INVENTION

1. Field of the Invention

The present invention relates to a rear-illuminated-type photodiode array that can be used as a receiving section for optical communication or a two-dimensionally arranged optical sensor.

2. Description of the Background Art

The field of optical communication has been achieving widespread adoption of the wavelength division multiplexing (WDM) technology, which enables the transmission and reception of a plurality of optical signals having different wavelengths through a single optical fiber. After the separation of the wavelength-multiplexed optical signals having traveled over a single optical fiber, in order to receive individual optical signals having a different wavelength, a group of independent photodiodes or a photodiode array is used. Because the diameter of the cladding of a single-mode optical fiber is 125 µm, it is desirable that the photodiodes be arranged with a pitch of 125 µm. However, in the case of independent photodiodes, it is difficult to reduce the pitch to such a small value.

In addition to the optical communication use, a photodiode array has a wide range of application. For example, it is used for a two-dimensionally arranged optical sensor and a sensor section of an image pickup tube. When a photodiode array has a small arranging pitch, if the light beam is slanted, the light-entering position can not be aligned precisely with the light-absorbing position when a rear-illuminated-type array is used. In this case, therefore, a front-illuminated-type array is used. Nevertheless, a rear-illuminated-type array can be used in some applications. When the light beam is nearly perpendicular to the light-entering plane, a rear-illuminated-type can also be used.

A photodiode array has a multitude of photodiode units arranged one- or two-dimensionally on one chip. The array has a structure in which a common n-electrode, a common n-type substrate, an absorption layer, a window layer, a plurality of p-regions, a plurality of p-electrodes, and so on are stacked on top of each other in layers.

Because photodiode units having a comparable function are arranged with a small pitch, electrical crosstalk poses a problem. The electrical crosstalk is caused through the following process. First, a lightwave having entered the vicinity of the pn junction of a photodiode produces electron-hole pairs. Then, some holes and electrons flow into a neighboring photodiode unit and produce a photocurrent for the neighboring photodiode unit. Consequently, the electrical crosstalk can be reduced by providing a groove to isolate photodiode units.

The published Japanese patent application Tokukai 2001-144278 has proposed a front-illuminated-type photodiode array provided with grooves between photodiode units. The groove has a depth reaching the vicinity of the substrate to isolate an absorption layer and a pn junction from those of another photodiode unit so that the electrical crosstalk can be reduced. The side wall of the isolation groove is coated with an insulation film, made of SiN or another material, formed by CVD or another proper method. Thus, the pn junction is protected.

Another published Japanese patent application, Tokukai 2001-352094, has also proposed a front-illuminated-type photodiode array provided with isolation grooves to reduce the electrical crosstalk. In this structure, first, the p-region is formed by epitaxial growth for an Si-based photodiode array. Then, the isolation grooves reaching the substrate are formed by etching to isolate photodiode units.

Both of the proposed arrays are front-illuminated-type photodiode arrays. Without regard to the type of photodiode, whether it is the front-illuminated-type or the rear-illuminated-type, a signal lightwave having entered an individual photodiode is absorbed by the individual absorption layer and produces electron-hole pairs. When the electrons and holes cross the pn junction, they produce a photocurrent.

However, not all of an incoming lightwave is absorbed in the absorption layer. A part of it passes through the absorption layer as a leakage lightwave and hits an electrode provided at the other end. The electrode is provided by forming an alloy such as AuZn on an InP crystal and then heating them to bond them mutually with ohmic contact. At this moment, constituents of the electrode and InP are mixed and recrystallization occurs. As a result, a complex crystal boundary is formed between the electrode and the InP crystal. The formed boundary surface is irregular, so that a lightwave is reflected from the boundary surface irregularly. Therefore, the leakage lightwave is irregularly reflected from the electrode at the other end, and part of it enters a neighboring unit photodiode and reaches its pn junction and absorption layer. That is, the reflected lightwave produces a photocurrent in the neighboring photodiode. In other words, a lightwave having entered a photodiode unit causes a noise to a neighboring photodiode unit. This is known as optical crosstalk.

As the spacing between neighboring photodiodes decreases, such optical crosstalk increases accordingly. The optical crosstalk can occur not only between the closest photodiode units but also between the second closest photodiode units and between the third closest photodiode units.

SUMMARY OF THE INVENTION

An object of the present invention is to prevent optical crosstalk in a rear-illuminated-type photodiode array that is to be used as a receiving section for optical communication or a two-dimensionally arranged optical sensor.

The present invention offers a rear-illuminated-type photodiode array that is provided with:

(a) a first-electroconductive-type semiconductor substrate;
(b) a first-electroconductive-type electrode that is placed at the rear side of the semiconductor substrate and that has a plurality of openings arranged one- or two-dimensionally;
(c) an antireflective coating provided at each of the openings of the first-electroconductive-type electrode;
(d) a first-electroconductive-type absorption layer that is formed at the front-face side of the semiconductor substrate and that has an absorption edge wavelength of $\lambda_{gr}$;
(e) a leakage-lightwave-absorbing layer that is provided on the absorption layer and that has an absorption edge wavelength, $\lambda_{ga}$, longer than the absorption edge wavelength, $\lambda_{gr}$, of the absorption layer ($\lambda_{ga} > \lambda_{gr}$);
(f) a plurality of second-electroconductive-type regions that are formed so as to penetrate through the leakage-lightwave-absorbing layer from the top surface and extend into the absorption layer to a certain extent and that are arranged one- or two-dimensionally at the positions coinciding with those of the antireflective coatings at the opposite side; and (g) a second-electroconductive-type electrode provided on the top surface of each of the second-electroconductive-type regions.

In accordance with an aspect of the present invention, the present invention offers a rear-illuminated-type photodiode array that is provided with:

(a) a first-electroconductive-type semiconductor substrate;
(b) an antireflective coating provided at the rear side of the semiconductor substrate;
(c) a first-electroconductive-type absorption layer that is formed at the front-face side of the substrate and that has an absorption edge wavelength of $\lambda_{gr}$;
(d) a leakage-lightwave-absorbing layer that is provided on the absorption layer and that has an absorption edge wavelength, $\lambda_{ga}$, longer than the absorption edge wavelength, $\lambda_{gr}$, of the absorption layer ($\lambda_{ga} > \lambda_{gr}$);
(e) a plurality of second-electroconductive-type regions that are formed so as to penetrate through the leakage-lightwave-absorbing layer from the top surface and extend into the absorption layer to a certain extent;
(f) a second-electroconductive-type electrode provided on the top surface of each of the second-electroconductive-type regions; and
(g) a first-electroconductive-type electrode provided on an exposed portion of the semiconductor substrate, the exposed portion being obtained by removing part of both the leakage-lightwave-absorbing layer and the absorption layer.

According to the present invention, in a rear-illuminated-type photodiode array, a leakage-lightwave-absorbing layer is provided between the front-face electrode and the absorption layer, as an innovation. Consequently, even when a lightwave having entered from the rear side is reflected irregularly from the front-face electrode, the lightwave is entirely absorbed by the leakage-lightwave-absorbing layer without entering a neighboring photodiode. As a result, the photodiode array can reduce optical crosstalk between neighboring photodiodes. This enables the achievement of a photodiode array having high sensitivity with less noise. Because the optical crosstalk between neighboring photodiode units is reduced, the spacing between photodiode units can be reduced more than ever before. Thus, the size of the photodiode array can be reduced further. In the case of a two- or one-dimensionally arranged sensor, the arranging pitch of the photodiodes can be reduced, so that the spatial resolution can be increased. When the photodiode array is used for a sensor in an image pickup system, the resolution can be increased.

DETAILED DESCRIPTION OF THE INVENTION

Figure 1:
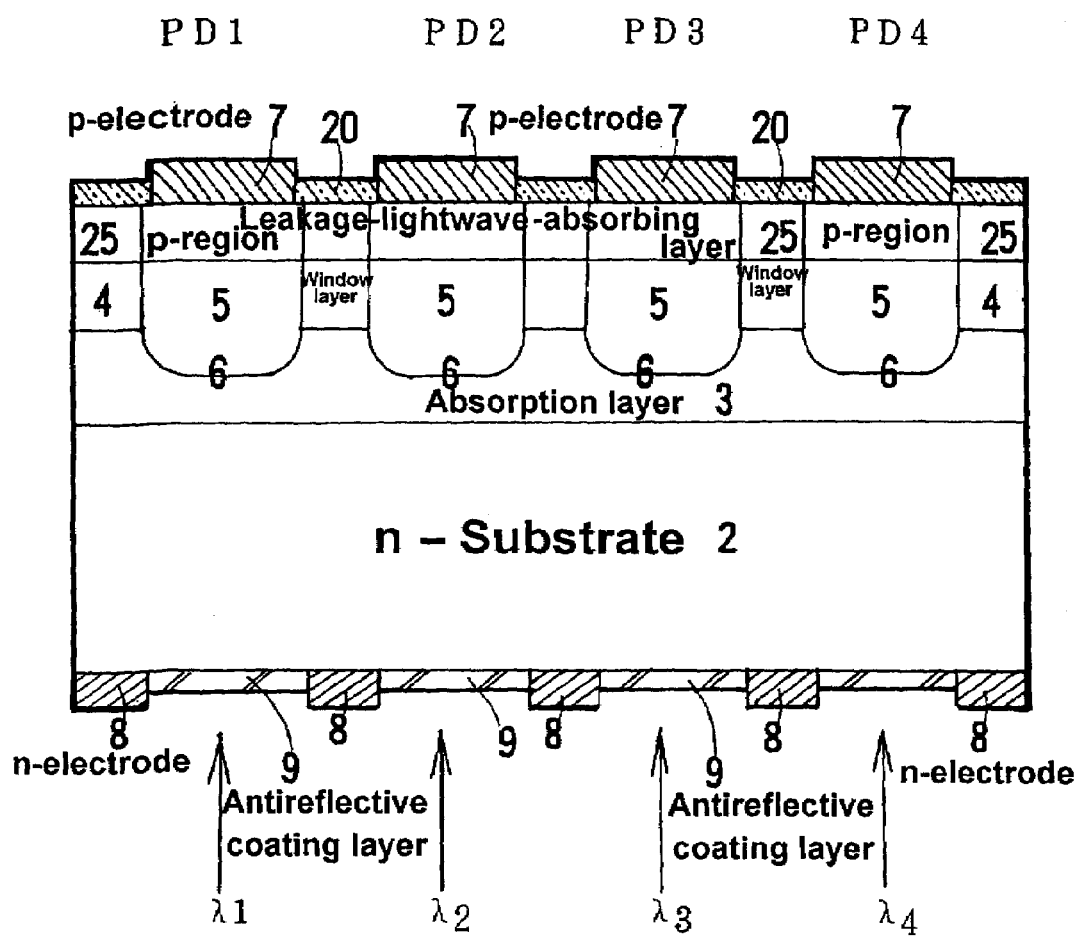
FIG. 1 is a cross-sectional view showing an example of a rear-illuminated-type photodiode array of the present invention.

Embodiments of the rear-illuminated-type photodiode array of the present invention are explained below in detail by referring to the accompanying drawing. In the drawing, the same reference signs are given to the same elements to avoid duplicated explanations. The ratio of the dimensions in the drawing does not necessarily coincide with the actual ratio.

The photodiode array of the present invention is provided with a leakage-lightwave-absorbing layer, which can absorb a signal lightwave, between the absorption layer and the front-face electrode. The leakage-lightwave-absorbing layer is formed by using a material that has an absorption edge wavelength, $\lambda_{ga}$, longer than the wavelength, $\lambda$, of the signal lightwave. The leakage-lightwave-absorbing layer is epitaxially grown on either the absorption layer or the window layer. Therefore, the condition for the leakage-lightwave-absorbing layer is to be capable of growing epitaxially on either the absorption layer or the window layer and to have an absorption edge wavelength, $\lambda_{ga}$, longer than the wavelength, $\lambda$, of the signal lightwave ($\lambda_{ga} > \lambda$). This can be expressed by using a band gap, $E_{ga}(=hc/\lambda_{ga})$. That is, a semiconductor material that has a band gap, $E_{ga}$, smaller than the energy, $hc/\lambda$, of the signal lightwave is used. The relation can be expressed as $E_{ga} < hc/\lambda$.

(a) The condition ($\lambda_{ga}$, i.e., $E_{ga}$) for the leakage-lightwave-absorbing layer when the wavelength, $\lambda$, of the signal lightwave is known:

$$\lambda_{ga} > \lambda, \text{ i.e., } E_{ga} < hc/\lambda.$$

This condition is the same as that of the absorption edge wavelength for the absorption layer. Consequently, the leakage-lightwave-absorbing layer may have the same composition as that of the absorption layer. It may also have a composition different from that of the absorption layer. When the wavelength, $\lambda$, of the signal lightwave is known, the condition is given by the formulas $\lambda_{ga} > \lambda$, i.e., $E_{ga} < hc/\lambda$. On the other hand, when it is not known, the band gap, $E_{ga}$, and the absorption edge wavelength, $\lambda_{ga}$, of the leakage-lightwave-absorbing layer can be determined in accordance with the band gap, $E_{gr}$, and the absorption edge wavelength, $\lambda_{gr}$, of the absorption layer. As described above, generally, the band gap of the leakage-lightwave-absorbing layer needs only to be smaller than the energy of the signal lightwave. Because the band gap of the absorption layer is smaller than the energy of the signal lightwave, the leakage-lightwave-absorbing layer is required only to have a band gap equal to or smaller than the band gap, $E_{gr}$, of the absorption layer, i.e., an absorption edge wavelength equal to or larger than the absorption edge wavelength, $\lambda_{gr}$, of the absorption layer. This can be summarized as follows.

(b) The condition ($\lambda_{ga}$, i.e., $E_{ga}$) for the leakage-lightwave-absorbing layer when the wavelength, $\lambda$, of the signal lightwave is not known:

$$\lambda_{ga} \geq \lambda_{gr}, \text{ i.e., } E_{ga} \leq E_{gr}.$$

The expression (b) is included in the expression (a). The range of the expression (b) is smaller than that of the expression (a).

The thickness of the leakage-lightwave-absorbing layer is required only to be sufficient to absorb the noise-causing lightwave sufficiently. However, if the thickness is excessively large, it is difficult to accomplish the epitaxial growth with good crystallinity. It is desirable that the thickness be 1 to 4 µm or so.

In an array in which an InGaAs absorption layer is formed on an InP substrate, the leakage-lightwave-absorbing layer is also made of InGaAs. The component ratio of the mixed crystal of the leakage-lightwave-absorbing layer may be either different from or the same as that of the absorption layer.

When a structure is employed in which a window layer is provided on an absorption layer and the leakage-lightwave-absorbing layer is placed on the window layer, the window layer can be made of InP. In this case, the matching with the substrate can be improved, so that the internal stress caused by the absorption layer can be decreased. Therefore, when the leakage-lightwave-absorbing layer, which has a mixed crystal, is placed on the window layer, the disturbance of the crystallinity can be reduced.

On the other hand, the leakage-lightwave-absorbing layer can also be placed directly on an absorption layer without using a window layer. In this case, the crystallinity is inevitably decreased. Considering this decrease, a leakage-lightwave-absorbing layer having a thickness of 1 to 3 µm or so is employed. An absorption layer is sometimes provided directly on the substrate. In some cases, on the other hand, a buffer layer is provided between the absorption layer and the substrate to improve the crystallinity. The buffer layer may be omitted as described above.

Consequently, the photodiodes of the array of the present invention may have any one of the following structures:

(1) p-electrodes, a leakage-lightwave-absorbing layer, a window layer, an absorption layer, an n-substrate, and an n-electrode.
(2) p-electrodes, a leakage-lightwave-absorbing layer, a window layer, an absorption layer, an n-buffer layer, an n-substrate, and an n-electrode.
(3) p-electrodes, a leakage-lightwave-absorbing layer, an absorption layer, an n-buffer layer, an n-substrate, and an n-electrode.
(4) p-electrodes, a leakage-lightwave-absorbing layer, an absorption layer, an n-substrate, and an n-electrode.

The above-listed structures are for an n-type photodiode array, in which an n-type absorption layer and, as required, an n-type window layer are provided on an n-type substrate by epitaxial growth and p-regions are formed by the diffusion of a dopant from above. Furthermore, a p-type photodiode array may also be used in which a p-type absorption layer and, as required, a p-type window layer are provided on a p-type substrate by epitaxial growth and n-regions are formed by the diffusion of a dopant. Examples of the structure of the p-type photodiode array are listed below.

(5) n-electrodes, a leakage-lightwave-absorbing layer, a window layer, an absorption layer, a p-substrate, and a p-electrode.
(6) n-electrodes, a leakage-lightwave-absorbing layer, a window layer, an absorption layer, a p-buffer layer, a p-substrate, and a p-electrode.
(7) n-electrodes, a leakage-lightwave-absorbing layer, an absorption layer, a p-buffer layer, a p-substrate, and a p-electrode.
(8) n-electrodes, a leakage-lightwave-absorbing layer, an absorption layer, a p-substrate, and a p-electrode.

FIG. 1 shows the structure of an example of the photodiode array of the present invention. An undoped (or low-doped) absorption layer 3, an n-type window layer 4, and an n-type leakage-lightwave-absorbing layer 25 are grown epitaxially on an n-type substrate 2. A mask is attached to the surface, and one- or two-dimensionally arranged windows are provided in the mask. Then, Zn is diffused into the crystal through the windows of the mask. This process produces p-regions 5, which penetrate through the leakage-lightwave-absorbing layer 25 and the window layer 4 in this order from above and extend into the absorption layer 3 to a certain extent. As a result, one- or two-dimensionally arranged independent p-regions 5 are formed. A p-electrode 7 is formed on a part or all of the top surface of the p-region 5 of each of the individual photodiode units. The p-electrode 7 is provided not on the window layer 4 but on the leakage-lightwave-absorbing layer 25. The p-electrode 7 can be bonded to the leakage-lightwave-absorbing layer 25 with ohmic contact. The portion where no p-electrodes 7 are provided, such as the intervening portion between the p-electrodes, is covered with a protection layer 20 made of $SiO_2$, SiN, or the like.

Openings for introducing a signal lightwave into an individual photodiode are provided at the rear side of the substrate 2. The openings are covered with antireflective coatings 9. An n-electrode 8 is provided at the portion other than the antireflective coatings 9. The n-electrode 8 and the n-type substrate are bonded with ohmic contact. The n-electrode 8 (cathode) is a common electrode for all photodiode units.

The structure in which the leakage-lightwave-absorbing layer 25 is provided between the window layer 4 and the electrode 7 is the essence of the concept of the present invention. The presence of the leakage-lightwave-absorbing layer is effective in preventing the optical crosstalk between neighboring photodiode units.

Figure 2:
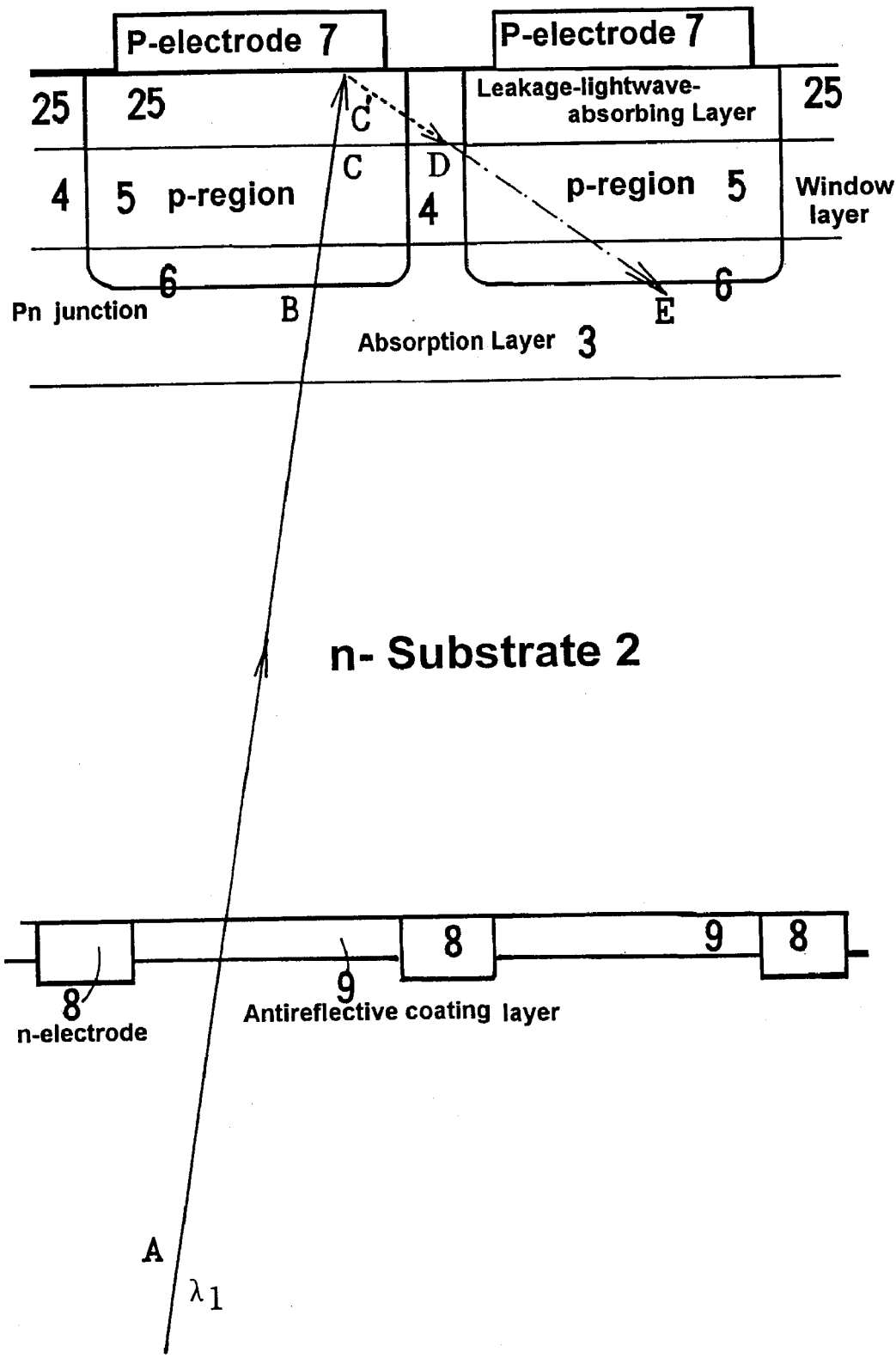
FIG. 2 is an illustration showing how optical crosstalk is decreased in a rear-illuminated-type photodiode array of the present invention, the illustration explaining that a signal lightwave $\lambda 1$ having entered PD1 from the rear side is absorbed in the leakage-lightwave-absorbing layer, so that it cannot reach the pn junction of the neighboring PD2.

The function of the photodiode array of the present invention is explained below by referring to FIG. 2. In this case, a reverse bias voltage is applied such that the n-electrode 8 (cathode) becomes positive and the p-electrodes 7 (anode) become negative. The p-electrode 7 (anode) of each unit photodiode is connected to an independent amplifying circuit. The n-electrode 8 is connected commonly. Signal lightwaves $\lambda 1$, $\lambda 2$, $\lambda 3$, and so on enter the array from the rear side. They are absorbed in the absorption layer 3 corresponding to PD1, PD2, PD3, and so on to produce electron-hole pairs. Electrons are attracted to the n-side by the action of the electric field, and holes to the p-side. As a result, individual photodiode units produce optical currents I1, I2, I3, and so on.

A signal lightwave $\lambda 1$ for PD1 enters the array from the rear side following route AB. Nearly all of the components of it are absorbed at point B. However, some of the components pass through point B and form a leakage lightwave. It travels in a straight line following route ABCC' and arrives at point C' at the rear side of the p-electrode 7. Because the rear side of the p-electrode is not necessarily smooth, the leakage lightwave is reflected irregularly from point C'. A part of the reflected lightwave travels in a direction, C'D, toward the absorption layer of the neighboring photodiode PD2. Because the leakage-lightwave-absorbing layer 25 lies between point C and point C' and between point C' and point D, the leakage lightwave is absorbed twice. Consequently, the leakage lightwave does not arrive at point D. No unnecessary electron-hole pairs are produced at point E, and therefore PD2 does not produce unnecessary optical current. In other words, the signal lightwave for PD1 does not cause a noise to PD2. As a result, the optical crosstalk between photodiode units of a photodiode array can be reduced.

EXAMPLE 1

Figure 3:
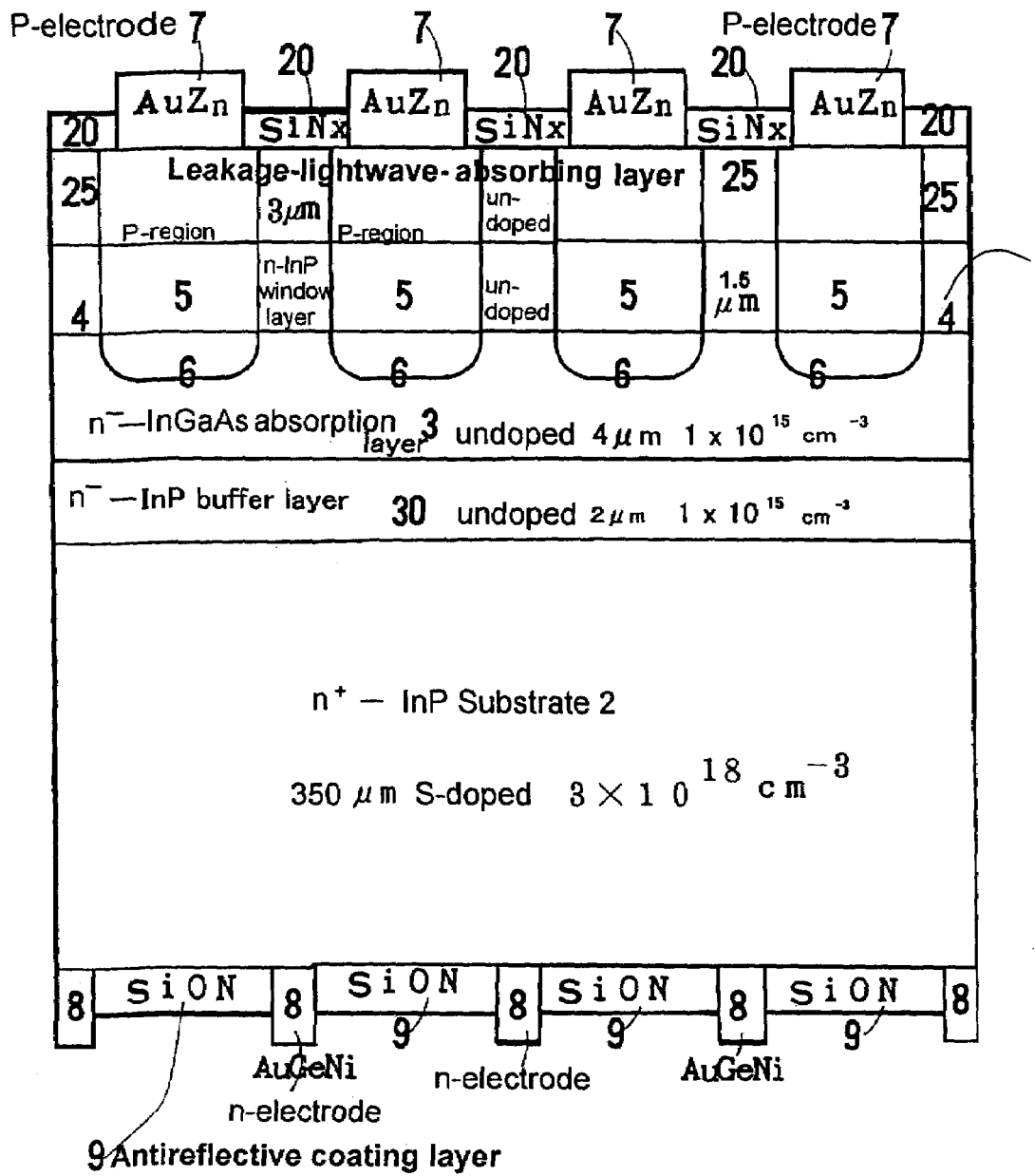
FIG. 3 is a cross-sectional view of a rear-illuminated-type photodiode array of Example 1 of the present invention.

One-dimensionally Arranged Photodiode Array (M×1: FIG. 3)

The method of producing a rear-illuminated-type photodiode array of the present invention shown in FIG. 3 is explained below. The following layers were epitaxially grown by the metalorganic vapor phase epitaxial method (MOVPE method) in the following order on an n-type InP substrate 2 that had a thickness of 350 μm, that was doped with sulfur, and that had a carrier concentration of $n=3\times10^{18}$ $cm^{-3}$:

- an n-type InP buffer layer 30 (thickness: 2 μm, undoped, and carrier concentration: $n=1\times10^{15}$ $cm^{-3}$);
- an n-type InGaAs absorption layer 3 (thickness: 4 μm, undoped, carrier concentration: $n=1\times10^{15}$ $cm^{-3}$, and lattice-matched with the InP);
- an n-type InP window layer 4 (thickness: 1.5 μm, undoped, and carrier concentration: $n=1\times10^{15}$ $cm^{-3}$); and
- an n-type InGaAs leakage-lightwave-absorbing layer 25 (thickness: 3 μm, undoped, and carrier concentration: $n=1\times10^{15}$ $cm^{-3}$).

Triethylgallium (TEG), trimethylindium (TMI), arsin ($AsH_3$), and phosphine ($PH_3$) were used as the material for the MOVPE growth. Monosilane ($SiH_4$) was used as the n-type dopant. In the epitaxial growth process, the temperature was 650° C. and the pressure was 40 Torr ($5.3\times10^3$ Pa).

An $SiN_x$ film was formed on the top surface of the epitaxially grown layers. Through holes having the same size were formed in a one- or two-dimensional arrangement with a constant pitch in the film by photolithography. The film provided with the holes was used as a mask. Then, Zn was diffused to form a plurality of p-type regions 5 that penetrate through the leakage-lightwave-absorbing layer 25 and the window layer 4 and extend into the absorption layer 3 to a certain extent. The boundary between a p-type region 5 and the n-type leakage-lightwave-absorbing layer 25, the window layer 4, and the absorption layer 3 became a pn junction 6.

A p-electrode 7 made of AuZn was formed on a part or all of the top surface of the p-region 5. An n-electrode 8 made of AuGeNi was formed at the rear side of the n-type InP substrate 2 so as to have openings corresponding to individual photodiodes. Both electrodes were heat-treated so that they could have ohmic contact with the underlying layer. Antireflective coatings (AR coatings) 9 made of SiON were formed at the rear side so as to cover the openings produced by the n-electrode. They were a one-layer antireflective coating produced such that the product of the layer thickness and the refractive index was equal to ¼ the wavelength of the signal lightwave.

The sensitivities of all photodiode units were measured by perpendicularly introducing signal lightwaves λ1, λ2, and so on (1.55-μm band) from the rear side, with a reverse bias voltage being applied such that the p-electrodes (anode) became negative and the n-electrode (cathode) became positive. The result showed that the sensitivity of the n-th PDn corresponding to the n-th signal lightwave λn was as high as 1 A/W. When the signal lightwave λ1 was introduced into PD1 perpendicularly from the rear side, the neighboring photodiode unit PD2 showed a sensitivity of 0.001 A/W. That is, the extinction ratio was 1/1,000. The result showed that noise suppression was sufficiently performed.

To further confirm the effect of the leakage-lightwave-absorbing layer, a 1.55-μm lightwave was introduced into PD1 from the rear side at a slanting angle to measure the optical current at the neighboring PD2. The result showed that the sensitivity of PD2 was less than 0.001 A/W. The leakage-lightwave-absorbing layer had a thickness of 3 μm. However, the reflected lightwave passes through it in a slanting direction, increasing its effective thickness. As described above, the present invention achieved an extinction ratio no less than 1/1,000 (−30 dB) by providing a leakage-lightwave-absorbing layer having a thickness of 3 μm.

EXAMPLE 2

Figure 4:
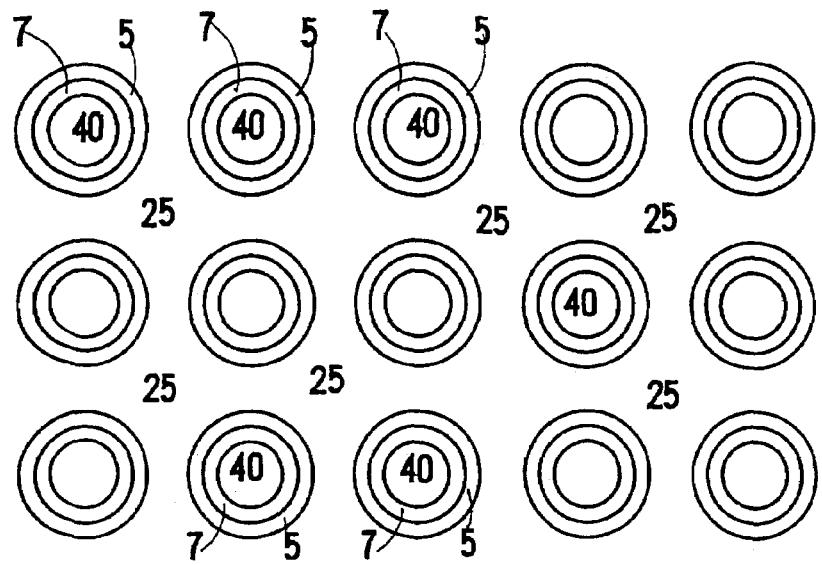
FIG. 4 is a plan view showing a rear-illuminated-type photodiode array of Example 2 of the present invention in which a group of photodiodes are placed in a two-dimensional arrangement expressed as "M×N."
Figure 5:
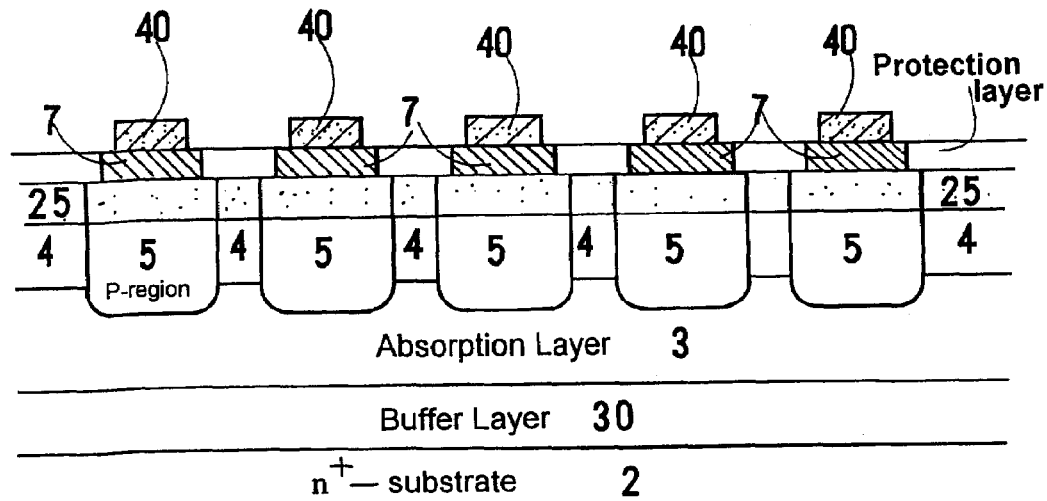
FIG. 5 is a vertical cross-sectional view of the two-dimensionally arranged photodiode array shown in FIG. 4.
Figure 5:
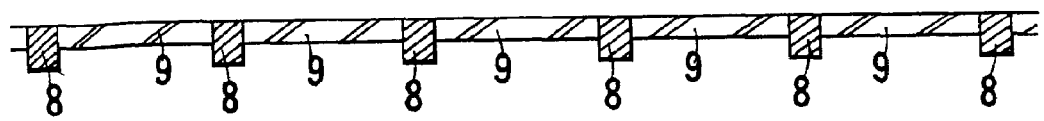

Two-dimensionally Arranged Photodiode Array (M×N: FIGS. 4 and 5)

The present invention can also be applied to a rear-illuminated-type two-dimensionally arranged photodiode array. FIG. 4 shows a partial plan view of it, and FIG. 5 shows a partial cross-sectional view of it. This array is formed by arranging photodiode units, "M×N" in number, on one chip. When viewed from above, a p-region 5, a p-electrode 7, and a bump 40 are concentrically placed to form a unit and a multitude of units are arranged in rows and columns like "islands" in a "sea" of the leakage-lightwave-absorbing layer 25. Actually, the top surface is covered with an antireflective coating and the p-electrodes 7 complementarily. The bumps 40 are made of a low-melting-point alloy formed by vapor deposition, plating, or printing and are to be used for soldering. They are provided to flip-chip-connect the array with an IC chip (such as one having amplifying circuits) provided with electrodes placed with the same two-dimensional arrangement. More specifically, an array of the present invention is placed upside down onto an IC chip having the above-described surface electrodes so that the two can have electrical contact. Then, they are heated to fuse the bumps. As a result, all of the electrodes, "M×N" in number, placed in an above-and-below position are soldered with one another concurrently. This design eliminates the need to spread the wiring on the top surface.

As shown in FIG. 5, the leakage-lightwave-absorbing layer 25 having a band gap smaller than the energy of the signal lightwave is provided between the p-electrode 7 and the absorption layer 3, with the window layer 4 being provided between the leakage-lightwave-absorbing layer 25 and the absorption layer 3. The leakage-lightwave-absorbing layer 25 absorbs the leakage lightwave twice because it is reflected from the p-electrode. Consequently, the optical crosstalk between photodiodes can be decreased.

The above-described array is connected to an IC chip directly by using the bumps on the top surface. The array can also be used in a way described below. A group of pads are placed at the periphery on the top surface. The p-electrodes are connected to the pads with wires running on the top surface. The pads are wire-bonded with lead pins, so that the array is housed in a package to be used as an independent device.

EXAMPLE 3

Figure 6:
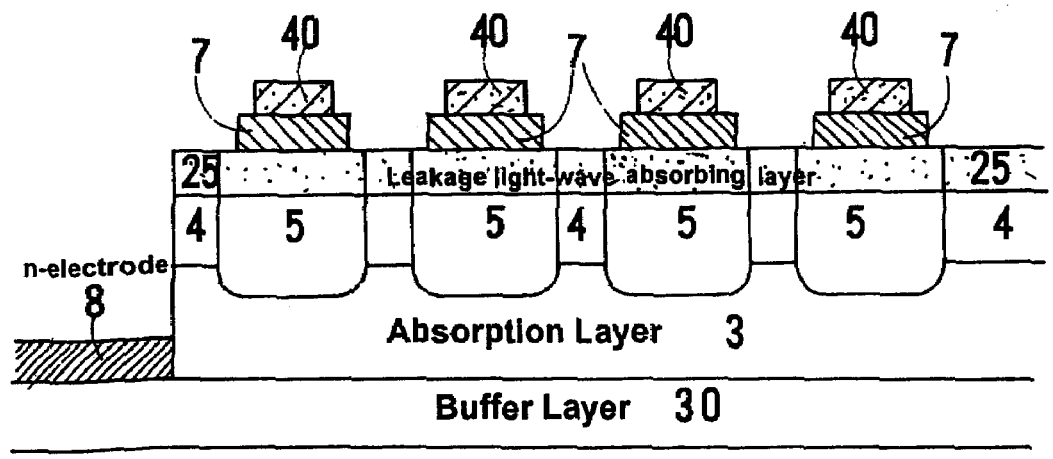
FIG. 6 is a cross-sectional view of a rear-illuminated-type photodiode array of Example 3 of the present invention.
Figure 6:
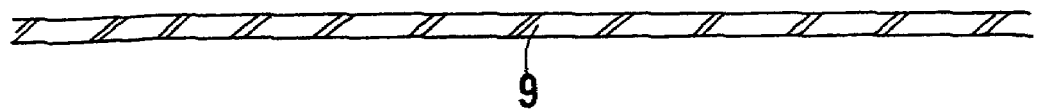

A Photodiode Array Having an N-Electrode Placed on a Substrate or Buffer Layer (FIG. 6)

Examples 1 and 2 show an array in which an n-electrode is provided at the rear side of the substrate. The present invention can also be applied to a photodiode array in which an n-electrode is provided on a portion of a substrate or buffer layer that is exposed by etching a part of the layers epitaxially grown on the substrate. FIG. 6 shows a partial cross-sectional view of the photodiode array. In this case, the photodiode units may be arranged one- or two-dimensionally. The photodiode array is provided with a buffer layer 30, an absorption layer 3, a window layer 4, and a leakage-lightwave-absorbing layer 25 all grown epitaxially on the n-type substrate. Individual p-electrodes 7 are provided on individual p-regions 5. Part of the leakage-lightwave-absorbing layer 25, the window layer 4, and the absorption layer 3 are removed by etching. An n-electrode 8 is placed on the exposed portion of the buffer layer. Alternatively, the buffer layer 30 may be omitted. In this case, also, part of the leakage-lightwave-absorbing layer 25, the window layer 4, and the absorption layer 3 are removed by etching. Then, an n-electrode 8 is placed directly on the exposed portion of the n-type substrate 2. Yet alternatively, the window layer 4 may be omitted. In Example 3, an antireflective coating 9 provided at the rear side of the n-type substrate 2 covers the entire rear surface of the substrate 2.

What is claimed is:

1. A rear-illuminated-type photodiode array comprising:
   (a) a first-electroconductive-type semiconductor substrate;
   (b) a first-electroconductive-type electrode that:
      (b1) is at a rear side of the semiconductor substrate; and
      (b2) has a plurality of openings arranged one- or two-dimensionally;
   (c) an antireflective coating at each of the openings of the first-electroconductive-type electrode;
   (d) a first-electroconductive-type absorption layer that:
      (d1) is at a front-face side of the semiconductor substrate; and
      (d2) has an absorption edge wavelength of $\lambda_{gr}$;
   (e) a leakage-lightwave-absorbing layer that:
      (e1) is over the entire absorption layer; and
      (e2) has an absorption edge wavelength, $\lambda_{ga}$, longer than the absorption edge wavelength, $\lambda_{gr}$, of the absorption layer ($\lambda_{ga} > \lambda_{gr}$);
   (f) a plurality of lightwave receiving parts comprising:
      (f1) a plurality of second-electroconductive-type regions that:
         (f11) penetrate through the leakage-lightwave-absorbing layer from the top surface and extend partially into the absorption layer; and
         (f12) are arranged one- or two-dimensionally at positions at the top surface so as to be substantially aligned with and opposite positions of the antireflective coatings; and
   (g) a second-electroconductive-type electrode provided on the top surface of each of the second-electroconductive-type regions,
      the array further comprising a window layer that is disposed between the absorption layer and the leakage-lightwave-absorbing layer, the window layer having an absorption edge wavelength, $\lambda_{gw}$, shorter than the absorption edge wavelength, $\lambda_{gr}$, of the absorption layer ($\lambda_{gw} < \lambda_{gr}$), and the second-electroconductive-type regions penetrating through the window layer.

2. A rear-illuminated-type photodiode array as defined by claim 1, the array further comprising a buffer layer that:
   (a) is between the substrate and the absorption layer; and
   (b) has an absorption edge wavelength, $\lambda_{gb}$, shorter than the absorption edge wavelength, $\lambda_{gr}$, of the absorption layer ($\lambda_{gb} < \lambda_{gr}$).

3. A rear-illuminated-type photodiode array as defined by claim 1, the array further comprising a buffer layer that:
   (a) is between the substrate and the absorption layer; and
   (b) has an absorption edge wavelength, $\lambda_{gb}$, shorter than the absorption edge wavelength, $\lambda_{gr}$, of the absorption layer ($\lambda_{gb} < \lambda_{gr}$).

4. A rear-illuminated-type photodiode array as defined by claim 3, wherein the buffer layer, the absorption layer, the window layer, and the leakage-lightwave-absorbing layer are epitaxial layers on the semiconductor substrate.

* * * * *